US012354919B2

(12) United States Patent
Chen et al.

(10) Patent No.: US 12,354,919 B2
(45) Date of Patent: Jul. 8, 2025

(54) MANUFACTURING METHOD OF PACKAGE CIRCUIT

(71) Applicant: Innolux Corporation, Miao-Li County (TW)

(72) Inventors: Yeong-E Chen, Miao-Li County (TW); Bi-Ly Lin, Miao-Li County (TW); Kuang Chiang Huang, Miao-Li County (TW); Yu Ting Liu, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 688 days.

(21) Appl. No.: 17/519,540

(22) Filed: Nov. 4, 2021

(65) Prior Publication Data

US 2022/0173000 A1  Jun. 2, 2022

(30) Foreign Application Priority Data

Dec. 1, 2020  (CN) .......................... 202011389533.5

(51) Int. Cl.
*H01L 21/66* (2006.01)
*H01L 23/00* (2006.01)
*G02F 1/1339* (2006.01)

(52) U.S. Cl.
CPC .............. *H01L 22/14* (2013.01); *H01L 22/12* (2013.01); *H01L 24/03* (2013.01); *G02F 1/1339* (2013.01); *H01L 2224/03001* (2013.01); *H01L 2224/037* (2013.01); *H01L 2224/117* (2013.01)

(58) Field of Classification Search
CPC ......... H01L 22/14; H01L 22/12; H01L 24/03; H01L 2224/03001; H01L 2224/037; H01L 2224/117; G02F 1/1309; G02F 1/1339
See application file for complete search history.

(56) References Cited

U.S. PATENT DOCUMENTS

| 5,258,705 A | 11/1993 | Okamoto et al. |
| 2007/0205520 A1* | 9/2007 | Chou ....................... H01L 24/12 |
| | | 257/E23.129 |
| 2010/0091229 A1* | 4/2010 | Liu ........................ G02F 1/1337 |
| | | 349/123 |

(Continued)

FOREIGN PATENT DOCUMENTS

| JP | H0682508 A | * 3/1994 |
| JP | 2002310933 A | * 10/2002 |

OTHER PUBLICATIONS

"Office Action of China Counterpart Application", issued on Mar. 28, 2024, p. 1-p. 7.

(Continued)

*Primary Examiner* — Ratisha Mehta
*Assistant Examiner* — Brad A Knudson
(74) *Attorney, Agent, or Firm* — JCIPRNET

(57) ABSTRACT

The embodiments of the disclosure provide a manufacturing method of a package circuit, including the following steps. A circuit structure including a plurality of conductive pads is formed. A liquid crystal layer is formed on the circuit structure. An inspection step is performed, and the inspection step includes determining the conductivity of the conductive pads according to the result of the rotation of a liquid crystal layer oriented with an electric field. In addition, the liquid crystal layer is removed.

5 Claims, 11 Drawing Sheets

(56) References Cited

U.S. PATENT DOCUMENTS

2010/0177313 A1\* 7/2010 Jun ...................... G02F 1/1309
356/366
2017/0269386 A1\* 9/2017 Xiang ............... G02F 1/133305
2021/0278735 A1\* 9/2021 Fujikawa ............. G09G 3/3688

OTHER PUBLICATIONS

"Office Action of China Counterpart Application", issued on Oct. 8, 2024, pp. 1-8.

\* cited by examiner ns of a package circuit according to another embodiment of the disclosure.
MANUFACTURING METHOD OF PACKAGE CIRCUIT

CROSS-REFERENCE TO RELATED APPLICATION

This application claims the priority benefit of China application serial no. 202011389533.5, filed on Dec. 1, 2020. The entirety of the above-mentioned patent application is hereby incorporated by reference herein and made a part of this specification.

BACKGROUND

Technology Field

The disclosure relates to a manufacturing method of an electronic device, and more particularly, to a manufacturing method of a package circuit.

Description of Related Art

With the continuous wide application of electronic devices having package circuits, the requirements for the manufacturing yield and the quality of the package circuits are getting higher and higher. Therefore, the manufacturing method (including the inspection method) of the package circuit of an electronic device requires continuous updates and adjustments.

SUMMARY

According to an embodiment of the disclosure, a manufacturing method of a package circuit includes the following steps. A circuit structure including a plurality of conductive pads is formed. A liquid crystal layer is formed on the circuit structure. An inspection step is performed, and the inspection step includes determining conductivity of the plurality of conductive pads according to a result of the rotation of the liquid crystal layer oriented with an electric field. In addition, the liquid crystal layer is removed.

According to an embodiment of the disclosure, a manufacturing method of a package circuit includes the following steps. A circuit structure including a plurality of conductive pads is formed. A liquid crystal layer is formed on a substrate, the substrate with the formed liquid crystal layer is disposed on the circuit structure, and the substrate is disposed between the circuit structure and the liquid crystal layer. An inspection step is performed, and the inspection step includes determining conductivity of the plurality of conductive pads according to a result of the rotation of the liquid crystal layer oriented with an electric field. In addition, the liquid crystal layer is removed.

DESCRIPTION OF THE EMBODIMENTS

Figure 1:
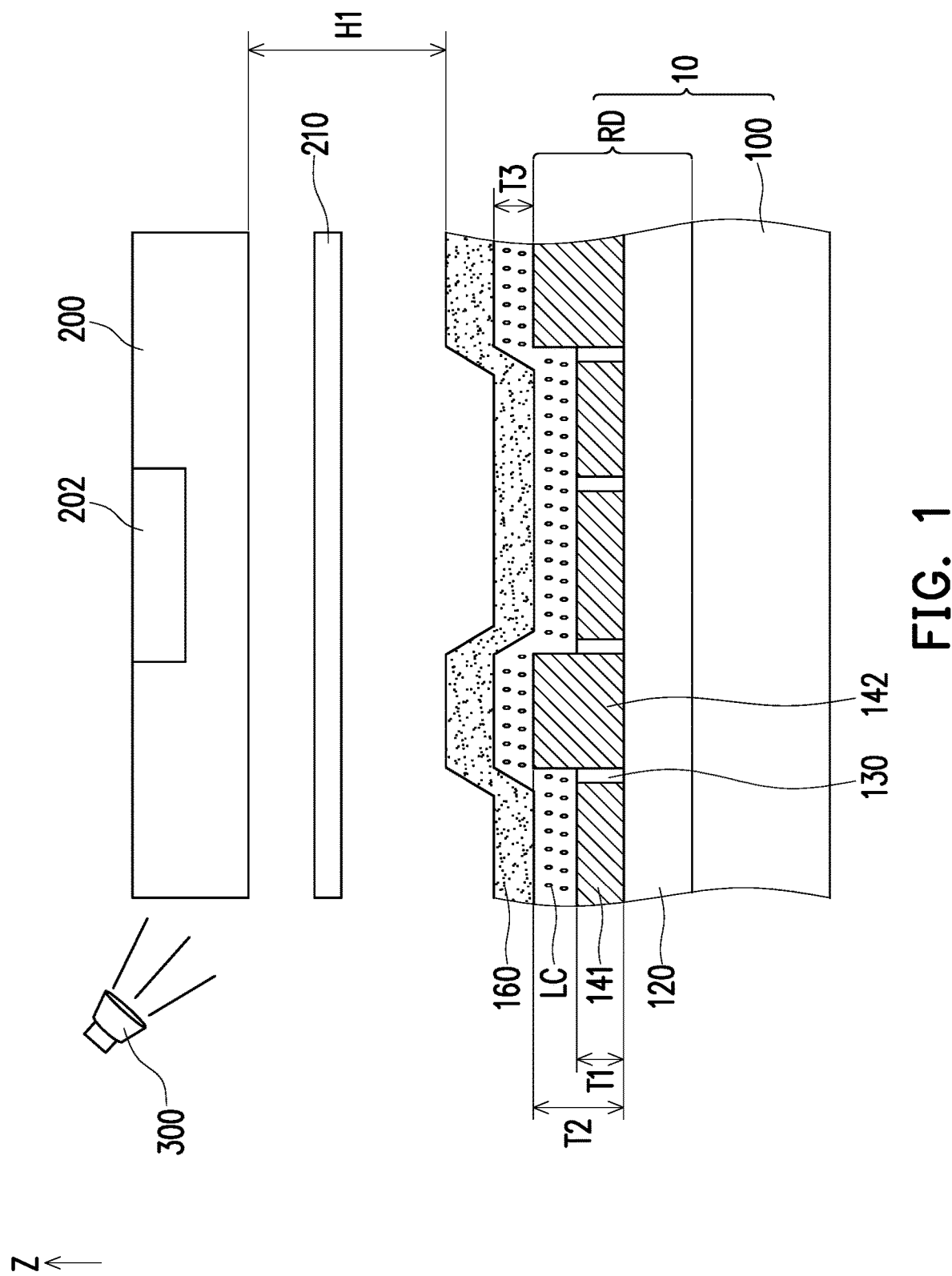
FIG. 1 is a schematic cross-sectional view of a package circuit in an inspection step according to an embodiment of the disclosure.

The disclosure may be understood by referring to the following detailed description with reference to the accompanying drawings. It is noted that for comprehension of the reader and simplicity of the drawings, in the drawings of the disclosure, only a part of the electronic device is shown, and specific components in the drawings are not necessarily drawn to scale. Moreover, the quantity and the size of each component in the drawings are only schematic and are not intended to limit the scope of the disclosure.

Throughout the specification and the appended claims of the disclosure, certain terms are used to refer to specific components. Those skilled in the art should understand that electronic device manufacturers may probably use different names to refer to the same components. This specification is not intended to distinguish between components that have the same function but different names. In the following specification and claims, the terms "including", "containing", "having", etc., are open-ended terms, so they should be interpreted to mean "including but not limited to . . . ". Therefore, when the terms "including", "containing" and/or "having" are used in the description of the disclosure, these terms specify the existence of corresponding features, regions, steps, operations and/or components, but do not exclude the existence of one or more corresponding features, regions, steps, operations and/or components.

Directional terminology mentioned in the specification, such as "top", "bottom", "front", "back", "left", "right", etc., is used with reference to the orientation of the drawings being described. Therefore, the used directional terminology is only intended to illustrate, rather than limit, the disclosure. In the drawings, each drawing illustrates the general features of the methods, structures, and/or materials used in specific embodiments. However, the drawings should not be interpreted as defining or limiting the scope or nature covered by the embodiments. For example, for clarity, a relative size, a thickness, and a location of each film layer, region, and/or structure may be reduced or enlarged.

It should be understood that when a component or a film layer is described as being "connected to" another component or film layer, it may be directly connected to the another component or film layer, or there is an intervening component or film layer therebetween. When a component is described as being "directly connected" to another component or film layer, there is no intervening component or film layer therebetween. Moreover, when a component is described as being "coupled to another component (or a variant thereof)", the component may be directly connected to the another component, or indirectly connected (e.g., electrically connected) to the another component via one or more components.

In the disclosure, the length and width can be measured by using an optical microscope, and the thickness can be measured based on a cross-sectional image in an electron microscope, but not limited to this. In addition, any two values or directions used for comparison may have certain errors.

The terms such as "about", "equal", "same", "substantially", or "approximately" are generally interpreted as being within a range of plus or minus 20% of a given value or range, or as being within a range of plus or minus 10%, plus or minus 5%, plus or minus 3%, plus or minus 2%, plus or minus 1%, or plus or minus 0.5% of the given value or range.

A structure (or layer, component, substrate) being located on another structure (or layer, component, substrate) described in the present disclosure may mean that two structures are adjacent and directly connected, or may mean that two structures are adjacent and indirectly connected. Indirect connection means that there is at least one intermediate structure (or intermediate layer, intermediate component, intermediate substrate, intermediate spacing) between two structures, the lower surface of a structure is adjacent or directly connected to the upper surface of the intermediate structure, and the upper surface of the other structure is adjacent or directly connected to the lower surface of the intermediate structure. The intermediate structure may be a single-layer or multi-layer physical structure or non-physical structure, which is not limited. In the present disclosure, when a structure is disposed "on" another structure, it may mean that a structure is "directly" disposed on another structure, or a structure is "indirectly" disposed on another structure, that is, at least one structure is sandwiched between a structure and another structure.

The terms such as "first", "second", and the like in this specification may be used for describing various elements, components, areas, layers, and/or parts, but the elements, components, areas, layers, and/or parts are not limited by such terms. The terms are only used to distinguish one element, component, area, layer, or part from another element, component, area, layer, or part. Therefore, a "first component", "first element", "first region", "first layer", or "first part" discussed below is used to distinguish it from a "second component", "second element", "second region", "second layer", or "second part", and is not used to define an order or a specific component, element, region, layer and/or part.

In the disclosure, the thickness, length, or width may be measured by an optical microscope, and the thickness may be measured according to a cross-sectional image in an electron microscope, but the disclosure is not limited thereto. In addition, there may be a certain error between any two values or directions used for comparison. If a first value is equal to a second value, it is implied that there may be an error of about 10% between the first value and the second value; if a first direction is perpendicular to a second direction, the angle between the first direction and the second direction may be 80 degrees to 100 degrees; and if the first direction is parallel to the second direction, the angle between the first direction and the second direction may be 0 degrees to 10 degrees.

All terms (including technical and academic terms) used herein have the same meaning that is commonly understood by those of ordinary skill in the art unless the terms are specifically defined. It is understandable that these terms, such as the terms defined in commonly used dictionaries, should be interpreted as having a meaning consistent with the relevant technology and the background or context of the disclosure but should not be interpreted in an idealized or overly formal way, unless the terms are specifically defined herein.

Note that in the disclosure, the features of multiple embodiments to be described below may be replaced, recombined, or mixed to form other embodiments without departing from the spirit of the disclosure.

The electronic device having the package circuit in the disclosure is capable of bringing about various application effects. The electronic device may include a display device, an antenna device, a sensing device, a splicing device, or a transparent display device, but the disclosure is not limited thereto. The electronic device may be a foldable, bendable, stretchable or flexible electronic device. The electronic device may, for example, include liquid crystals, light-emitting diodes (LEDs), or quantum dots (QDs), fluorescence, phosphors, other suitable materials, or a combination thereof, and the material can be any combination of the arrangements, other suitable display media, or a combination thereof. The light-emitting diodes may include, for example, organic light-emitting diodes (OLEDs), mini LEDs, micro LEDs, or quantum dot light-emitting diodes (QLEDs, QDLEDs), but the disclosure is not limited thereto. The antenna device may be, for example, a liquid crystal antenna, but the disclosure is not limited thereto. The splicing device may be, for example, a display splicing device or an antenna splicing device, but the disclosure is not limited thereto. Note that the electronic device (including the package circuit) may be in a rectangular shape, a circular shape, a polygonal shape, a shape with curved edges, or other suitable shapes. In the disclosure, the package circuit is adopted to illustrate the content of the disclosure, but the disclosure is not limited thereto.

In the disclosure, various embodiments described below may be used in any combination without departing from the spirit and scope of the present disclosure, for example, some features of one embodiment may be combined with some features of another embodiment to form another embodiment.

Reference will now be made in detail to the exemplary embodiments of the disclosure, examples of which are illustrated in the accompanying drawings. Whenever possible, the same reference numerals are used to represent the same or similar parts in the accompanying drawings and description.

FIG. 1 is a schematic cross-sectional view of a package circuit in an inspection step according to an embodiment of the disclosure. For clarity of the drawings and convenience of description, several components are omitted in FIG. 1. Referring to FIG. 1 first, a package circuit 10 of the disclosure includes a substrate 100 and a circuit structure RD. The circuit structure RD includes a redistribution layer (RDL) structure, for example. In some embodiments, in the manufacturing method of the package circuit 10, bonding an electronic component on the circuit structure RD after performing the inspection step, the circuit structure RD (such as the redistribution layer structure) may be electrically tested in the inspection step; and the electronic component includes, but is not limited to, an integrated circuit (IC), for example. The manufacturing method of the package circuit in the embodiment of the disclosure includes an inspection step to prevent electronic components (e.g., integrated circuits) from being coupled to a circuit structure RD with poor conductivity. Accordingly, the manufacturing method of the package circuit 10 has the effect of facilitating the process or the effect of reducing the cost. In the following paragraphs, the steps of the manufacturing method of the package circuit 10 are briefly illustrated.

First, the substrate 100 is provided. The substrate 100 of the package circuit 10 may include a rigid substrate, a flexible substrate, or a combination thereof. The material of the substrate 100 may include glass, quartz, ceramic, sapphire, plastic, polycarbonate (PC), polyimide (PI), polypropylene (PP) or polyethylene terephthalate (PET), other suitable materials, or a combination thereof, for example, but the disclosure is not limited thereto. The light transmittance of the substrate 100 is not limited, and the substrate 100 may be a transparent substrate, a semi-transparent substrate, or a non-transparent substrate.

Next, the circuit structure RD is formed on the substrate 100 in a normal direction Z of a surface of the substrate 100. The circuit structure RD includes a plurality of conductive pads. In detail, the circuit structure RD includes an interconnection structure 120 disposed on the substrate 100 and the plurality of conductive pads 141 and 142 disposed on the interconnection structure 120, but the disclosure is not limited thereto. In some embodiments, the interconnection structure 120 is a lower circuit layer in the circuit structure RD. The interconnection structure 120 includes a stack of multiple dielectric layers and multiple conductive layers alternately stacked (not shown), but the disclosure is not limited thereto. The dielectric layer may include a single-layer or multi-layer structure, and the material of the dielectric layer may include organic materials, inorganic materials, or a combination thereof, but the disclosure is not limited thereto. The organic material may include polyethylene terephthalate (PET), polyethylene (PE), polyethersulfone (PES), polycarbonate (PC), polymethylmethacrylate (PMMA), polyimide (PI), photo sensitive polyimide (PSPI), or a combination thereof; and the inorganic material may include silicon nitride, silicon oxide, silicon oxynitride, or a combination thereof, but the disclosure is not limited thereto. The conductive layer may be a single layer of conductive material or a stack of multiple layers of conductive material, and the material of the conductive layer may include molybdenum (Mo), nickel (Ni), chromium (Cr), tungsten (W), aluminum (Al), titanium (Ti), copper (copper, Cu), tin (Sn), silver (Ag), gold (Au), other suitable metals, alloys thereof, or a combination thereof. In some embodiments, the multiple layers of conductive layers may be separated by multiple layers of dielectric layers, and the multiple conductive layers may be electrically connected to one another through multiple connection structures (not shown) penetrating the dielectric layers, but the disclosure is not limited thereto.

In some embodiments, the conductive pads (e.g., the conductive pads 141 and the conductive pads 142) may be disposed on the interconnection structure 120. Specifically, an insulating layer 130 may be disposed or formed on the interconnection structure 120. The insulating layer 130 can be patterned to include multiple openings (not shown), and the conductive pads (e.g., the conductive pads 141 and the conductive pads 142) respectively may correspond to and be disposed in the openings of the insulating layer 130. The conductive pads (e.g., the conductive pads 141 and the conductive pads 142) respectively may be coupled to the conductive layer in the interconnection structure 120, but the disclosure is not limited thereto. The quantity of the conductive pads shown in FIG. 1 does not limit the quantity of the conductive pads in the embodiment of the disclosure, and the quantity of the conductive pads in the embodiment may be increased or decreased according to the needs of the user. In some embodiments, the conductive pads are conductive bumps serving as the circuit structure RD, for example, and the conductive pads may be coupled to electronic components (e.g., integrated circuits) in the subsequent process.

In some embodiments, the material of the conductive pad may be similar to that of the conductive layer of the interconnection structure 120, such as molybdenum, nickel, chromium, cobalt, zirconium, tungsten, aluminum, titanium, copper, tin, silver, gold, other suitable metals, alloys thereof, or a combination thereof. The conductive pads (e.g., the conductive pads 141 and the conductive pads 142) may be a single-layer metal layer or a stack of multiple metal layers, but the disclosure is not limited thereto.

In some embodiments, the top surfaces of different conductive pads (e.g. the conductive pads 141 and the conductive pads 142) may be or may not be flush with one another. For example, as shown in FIG. 1, the top surfaces of the conductive pads 141 may not be flush with the top surfaces of the conductive pads 142.

In some embodiments, a thickness T1 of the conductive pad 141 may be the same as or different from a thickness T2 of the conductive pad 142 adjacent to the conductive pad 141, but it is not limited thereto. The thickness T1 and the thickness T2 may be defined as the maximum thickness of the conductive pad in the normal direction Z of the surface of the substrate 100.

In some embodiments, after the circuit structure RD is completed, a process, such as bonding an electronic components (e.g., integrated circuits) may be performed on the package circuit 10 for application in the semiconductor field, the display field, or other electronic device fields. Before bonding the electronic components (e.g., integrated circuits), the electrical quality of the conductive pads (e.g., the conductive pads 141 and the conductive pads 142) can be determined through the inspection step first to reduce the risk of disposing the electronic components (e.g., integrated circuits) in a package circuit that does not meet the electrical quality requirements.

In the embodiment, before performing the inspection step, a liquid crystal layer LC is formed on the circuit structure RD. In some embodiments, for example, the liquid crystal layer LC includes polymer-dispersed liquid crystals (PDLCs), cholesterol liquid crystals, polymer liquid crystals, dye-doped liquid crystals, electrophoretic display media, other suitable materials, or a combination thereof. In some embodiments, the liquid crystal molecules included in the liquid crystal layer LC include negative type liquid crystals or positive type liquid crystals.

In some embodiments, after disposing the liquid crystal layer LC on the circuit structure RD, a curing process can be selectively performed according to the material characteristics of the liquid crystal layer LC to complete the configuration of the liquid crystal layer LC. In some embodiments, the liquid crystal layer LC may cover the entire or part of the circuit structure RD (the conductive pads 141 and the conductive pads 142). The liquid crystal layer LC may have a thickness T3, and the thickness T3 may be defined as the maximum thickness of the liquid crystal layer LC in the normal direction Z of the surface of the substrate 100. In some embodiments, the thickness T3 of the liquid crystal layer LC may range from 2 μm to 50 μm (e.g., 2 μm≤the thickness T3≤50 µm) or from 5 µm to 30 µm (5 µm≤the thickness T3≤30 µm), but the disclosure is not limited thereto. In some embodiments, multiple spacers (not shown) may be disposed in the liquid crystal layer LC, and the spacers may be used to maintain the thickness of the liquid crystal layer, but the disclosure is not limited thereto.

Next, a transparent conductive layer 160 is formed on the liquid crystal layer LC. The material of the transparent conductive layer 160 includes indium tin oxide (ITO), indium oxide (In2O3), tin oxide (SnO2), zinc oxide (ZnO), other suitable materials, or a combination thereof, but the disclosure is not limited thereto.

The step of determining the conductivity of the plurality of the conductive pads comprises inspecting the result of the rotation of the liquid crystal layer by an inspection component 200. The inspection component 200 may include a detector head. In some embodiments, the inspection component 200 may include a sensor 202. The sensor 202 includes a photosensor, an image sensor, or other suitable sensors, for example. In some embodiments, a photosensor, an image sensor, or other suitable sensors are used to inspect the result of the rotation of the liquid crystal layer LC.

Next, the inspection step is performed. The inspection step includes providing a power signal first to apply the predetermined voltages to at least one of the conductive pads (including the conductive pads 141 or the conductive pads 142) and the transparent conductive layer 160 respectively to generate an electric field. Taking FIG. 1 as an example, by applying the predetermined voltages to different conductive pads, for example, a vertical electric field can be generated between the conductive pads and the transparent conductive layer 160. Then, when the conductive pads receive the predetermined voltages as expected and an electric field is generated, the electric field may change the arrangement of the liquid crystal molecules (not shown) in the liquid crystal layer LC. For example, the liquid crystal molecules, according to their characteristics, can be rotated according to the electric field. Next, a light source 300 with directivity can be selectively used as an inspection light in the inspection step. In some embodiments, the light source 300 may be a light source without directivity, such as an ambient light source, but it is not limited thereto. Then, the user can determine the conductivity of the plurality of conductive pads (including the conductive pads 141 or the conductive pads 142) according to the result of the rotation of the liquid crystal molecules of the liquid crystal layer LC oriented with the electric field.

In the inspection step of some embodiments, the conductivity or electrical quality of the conductive pads (including the conductive pads 141 or the conductive pads 142) can be determined by inspecting the reflection degree of light reflected by the conductive pads. For example, the liquid crystal layer LC between the conductive pads 141 and the transparent conductive layer 160 may be rotated as expected when the electric field (e.g., a vertical electric field) is generated between the conductive pads 141 and the transparent conductive layer 160, and then the inspection light emitted by the light source 300 can pass through the liquid crystal layer LC and be reflected by the conductive pad 141 (e.g., the surface of the conductive pad 141) when the voltage received by the conductive pad 141 is close to the predetermined voltage (i.e., the line connected to the conductive pad 141 may be a normal connection), and when the voltage received by the conductive pad 142 is less than the predetermined voltage (i.e., a short circuit may occur in the line connected to the conductive pad 142 and the predetermined voltage cannot be received), since the voltage received by the conductive pad 142 may be less than the predetermined voltage, the expected electric field (e.g., a vertical electric field) may not be generated between the conductive pads 142 and the transparent conductive layer 160, and the liquid crystal layer LC located between the conductive pads 142 and the transparent conductive layer 160 may not be rotated as expected (or the degree of rotation is not as expected). The amount of the inspection light emitted by the light source 300 passing through the liquid crystal layer LC between the conductive pads 142 and the transparent conductive layer 160 may be different from that passing through the liquid crystal layer LC between the conductive pads 141 and the transparent conductive layer 160, and the amount of light reflected by the conductive pads 142 (e.g., the surfaces of the conductive pads 142) subsequently may be different. The light of the inspection light reflected by the conductive pad 141 or the light of the inspection light reflected by the conductive pad 142 can be inspected and output by the sensor 202 of the inspection component 200, and by presenting the reflected light of the conductive pad 141 or the reflected light of the conductive pad 142 respectively as an image or a numerical text, the conductivity of different conductive pads and the conductivity of their respective connected lines can be determined and whether there is a problem of short circuit can be determined. In detail, the voltage of the conductive pad 141 may be close to the predetermined voltage, the corresponding liquid crystal molecules of the liquid crystal layer LC on the conductive pad 141 (or between the conductive pads 141 and the transparent conductive layer 160) may be rotated oriented with the electric field, and more inspection light passes through the conductive pad 141 and is reflected by the conductive pad 141. The reflected light is the first reflected light, for example. The voltage of the conductive pad 142 may be less than the predetermined voltage, the proportion of the corresponding liquid crystal molecules of the liquid crystal layer LC on the conductive pad 142 (or between the conductive pads 142 and the transparent conductive layer 160) rotated oriented with the electric field may be small, less inspection light passes through the conductive pad 142 and is reflected by the conductive pad 142, and the reflected light is the second reflected light, for example. The image intensity (e.g., the brightness of the image light) or the numerical text generated by the first reflected light may be greater than the image intensity or the numerical text generated by the second reflected light. Compared to the conductive pad 141, the conductive pad 142 may display a darker image and is determined as failing to meet the expected standard, so the user can determine that the conductivity of the second conductive pad 142 is abnormal. The above description is to schematically explain the rationale of determining the conductivity of the conductive pads in the inspection step and is not intended to limit the conductivity of the conductive pads 141 and 142 of the disclosure.

Accordingly, the user can determine whether the conductivity of the conductive pad 141 or the conductivity of the conductive pad 142 meets the expected standard by the brightness of the image or the value of the image. If it is determined that it fails to meet the expected standard, the conductivity of the conductive pad can be regarded as abnormal. In other embodiments, there may be other ways to determine whether the conductive pad is conductive or not according to different conditions of a stack of the package circuit or different selections of the material of the liquid crystal layer.

Note that in the inspection step in the disclosure, it is not limited that the same predetermined voltage (i.e., the same predetermined voltage) is required to be applied to different conductive pads (e.g., the conductive pads 141 and the conductive pads 142). In some embodiments, the predetermined voltage of the conductive pad 141 and the predetermined voltage of the conductive pad 142 may be different, and the conductivity of the conductive pads can be determined according to the result of the brightness or the value of the image generated by the conductive pads in the inspection step. In some embodiments, in the inspection step in the disclosure, it is not limited that the predetermined voltages are required to be applied to different conductive pads (e.g. the conductive pads 141 and the conductive pads 142) at a same time point. Different conductive pads (e.g. the conductive pads 141 and the conductive pads 142) respectively can also be applied with the predetermined voltages at different time points, an electric field may be generated between the conductive pads and the transparent conductive layer 160 respectively, and the conductivity of the different conductive pads respectively is determined according to the result of the rotation of the corresponding liquid crystal layer LC oriented with the electric field.

In the manufacturing method of the package circuit10 in an embodiment of the disclosure, the liquid crystal layer LC may be formed on a circuit structure RD to be inspected, and then the conductivity of the conductive pads 141 and 142 is determined according to the result of the rotation of the liquid crystal molecules of the liquid crystal layer LC oriented with the electric field. The inspection method is a non-contact inspection, which can reduce the risk of damages to the conductive pads (e.g., the conductive pads 141 and the conductive pads 142) during inspection. Moreover, the liquid crystal layer LC is disposed on the circuit structure RD, so an inspection distance H1 between the inspection component 200 and the circuit structure RD may not be limited. The inspection distance H1 is defined as the shortest inspection distance between the inspection surface of the inspection component 200 and the top surface of the transparent conductive layer 160 (the surface adjacent to the inspection component 200), but it is not limited thereto. In the step of determining the conductivity of the plurality of the conductive pads, inspecting the result of the rotation of the liquid crystal layer LC by an inspection component is performed. The inspection component 200 may be separated from the circuit structure RD, there is an inspection distance H1 between the inspection component 200 and the circuit structure RD, and the inspection distance H1 is greater than 1 cm. Moreover, since in the manufacturing method of the package circuit10, the inspection step can be performed during the manufacturing process, the probability of bonding the electronic components to the package circuit that fails to meet the standard can be reduced in the subsequent process, thereby reducing the cost or improving the quality.

In some embodiments, the manufacturing method of the package circuit10 may further selectively include disposing a polarizer 210 on the liquid crystal layer LC (or the transparent conductive layer 160) first before performing the inspection step. Taking FIG. 1 as an example, the polarizer 210 may be disposed between the liquid crystal layer LC and the inspection component 200. In some embodiments, the polarizer 210 may be disposed between the transparent conductive layer 160 and the inspection component 200. In some embodiments, the polarizer 210 may be directly disposed on the transparent conductive layer 160, but the disclosure is not limited thereto. With the configuration of the polarizer 210, the contrast between the brightness and darkness of the reflected light can be more significant, which can enhance the acumen of determining the conductivity of the conductive pads in the inspection step. In some embodiments (not shown), before the step of disposing the liquid crystal layer LC, a liquid crystal alignment layer (not shown) may be selectively formed on the circuit structure RD according to the type of the liquid crystal layer LC, but the disclosure is not limited thereto.

Next, after the inspection step is completed, the liquid crystal layer LC is removed. The method of removing the liquid crystal layer LC includes using acetone, alcohol, or other suitable solvents, but the disclosure is not limited thereto. In some embodiments, the method of removing the liquid crystal layer LC includes a physical tearing method, but the disclosure is not limited thereto. In some embodiments, the liquid crystal layer LC and/or the transparent conductive layer 160 may be disposed on a substrate, subsequently the substrate (refer to the substrate 150 in FIG. 5 in the subsequent paragraphs) including the liquid crystal layer LC and/or the transparent conductive layer 160 may be disposed on the circuit structure RD, and the substrate (refer to the substrate 150 in FIG. 5 in the subsequent paragraphs) may be located between the circuit structure RD and the liquid crystal layer LC. After the inspection step is completed as described above, subsequently both the liquid crystal layer LC and the transparent conductive layer 160 can be removed by tearing off the substrate (refer to the substrate 150 in FIG. 5 in the subsequent paragraphs), but it is not limited thereto. The substrate may include a flexible substrate, such as a polyimide substrate or other suitable materials, but the disclosure is not limited thereto.

In some embodiments, the torn-off substrate (with the liquid crystal layer LC and the transparent conductive layer 160 thereon) can be reused on other package circuits to be inspected, thereby saving the cost or facilitating the process.

Other embodiments are provided below for explanation of the manufacturing method. It should be noted that the following embodiments adopt the reference numbers and partial contents of the foregoing embodiments, wherein the same reference numbers are used to indicate the same or similar elements, and the description of the same technical content is omitted. For the description of the omitted parts, reference may be made to the foregoing embodiments, and the same content will not be iterated in the following embodiments.

Figure 2:
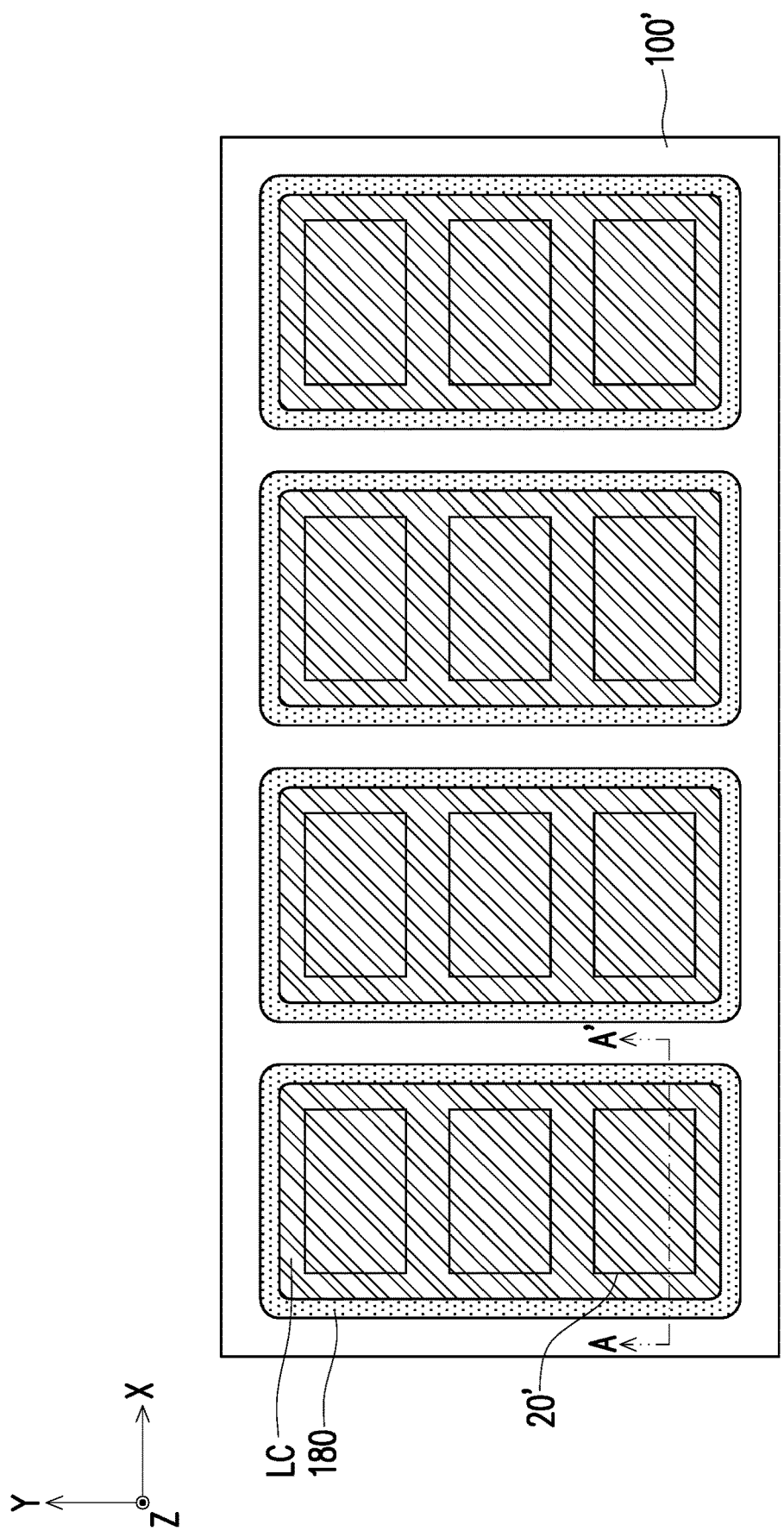
FIG. 2 is a schematic cross-sectional view of a package circuit to be cut according to an embodiment of the disclosure.
Figure 3:
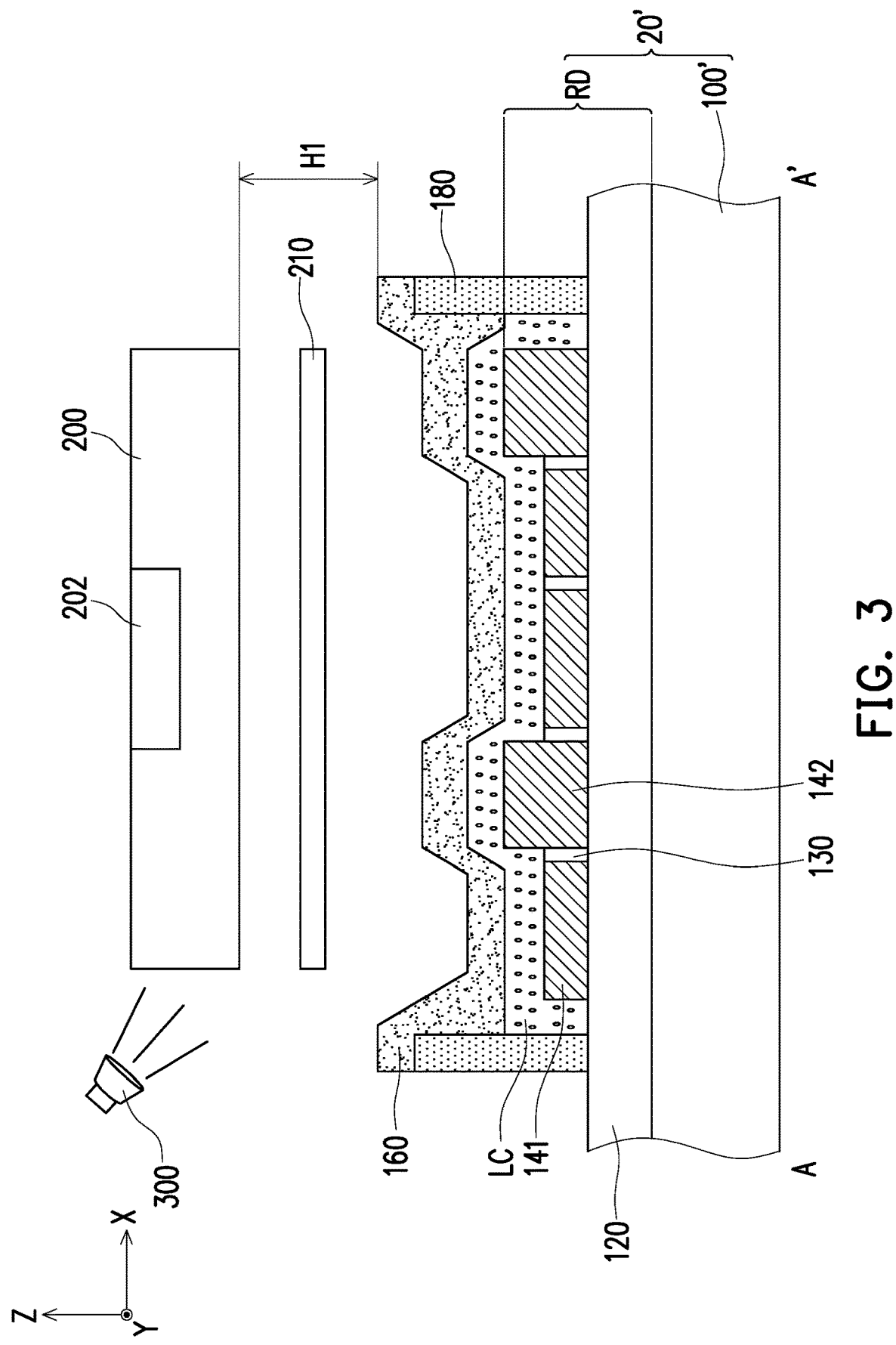
FIG. 3 is a schematic cross-sectional view of the package circuit to be cut taken along the line AA' in FIG. 2.

FIG. 2 is a schematic cross-sectional view of a package circuit to be cut according to an embodiment of the disclosure. FIG. 3 is a schematic cross-sectional view of the package circuit to be cut taken along the line AA' in FIG. 2. For clarity of the drawings and convenience of description, several components are omitted in FIG. 2 and FIG. 3. The difference between the manufacturing method shown in the embodiment and the manufacturing method of the package circuit 10 in FIG. 1 is that the manufacturing method of the package circuit further includes forming a sealant 180 on the circuit structure RD, and the sealant 180 can surround the liquid crystal layer LC.

The manufacturing method of the package circuit in the embodiment may include forming multiple package circuits 20' to be cut on a substrate 100' (e.g., a mother substrate) to be cut, and then forming multiple single package circuits (e.g., the package circuit 10 shown in FIG. 1) through a cutting process. Specifically, the manufacturing method of the embodiment includes the following steps. The substrate 100' (the mother substrate) to be cut is provided first, which can be cut into multiple packaged components in the subsequent process, and the packaged components respectively have the package circuits 20'.

Next, multiple circuit structures RD are formed on the substrate 100'. Referring to both FIG. 2 and FIG. 3, the interconnection structure 120 may be disposed on the substrate 100'. Next, the conductive pads (e.g., the conductive pads 141 and the conductive pads 142) are disposed on the interconnection structure 120. In some embodiments, multiple package circuits 20' to be cut can be sequentially arranged along the X-axis and/or the Y-axis, but it is not limited thereto. The X-axis is substantially perpendicular to the Y-axis, and the X-axis or the Y-axis is perpendicular to the normal direction Z of the surface of the substrate 100. In some embodiments, multiple package circuits 20' may be arranged in an array or in other manners before performing the cutting process. In some embodiments, multiple package circuits 20' may be arranged in multiple horizontal rows along the X axis or in multiple vertical rows along the Y axis before performing the cutting process. For example, the substrate 100' may include three horizontal rows and four vertical rows of the package circuits 20' before performing the cutting process. Note that the quantity and the arrangement of the package circuits 20' before performing the cutting process shown in FIG. 2 are not intended to limit the disclosure. The quantity and the arrangement of the package circuits that can be cut from the substrate 100' (the mother substrate) may be adjusted according to the need of the user.

Next, a sealant 180 is formed on the circuit structure RD, and the sealant 180 can surround at least one or more package circuits 20'. In some embodiments, the sealant 180 may surround the conductive pads (e.g., the conductive pads 141 and the conductive pads 142) in the package circuit 20' before performing the cutting process. As shown in FIG. 2, in the normal direction Z of the surface of the substrate 100, the outer shape of the sealant 180 may have a rectangular shape with arc corners, but it is not limited thereto. The sealant 180 may be designed with other outer shapes according to requirements. In some embodiments, the quantity of the package circuits 20' surrounded by the sealant 180 before performing the cutting process can be increased or decreased. The arrangement of the package circuit 20' surrounded by the sealant 180 before performing the cutting process is not limited to the quantity or the arrangement shown in FIG. 2. For example, the material of the sealant 180 includes photosensitive photoresist, photosensitive resin or thermosetting resin, or other suitable materials, but the disclosure is not limited thereto.

Next, the liquid crystal layer LC is formed on a plurality of conductive pads (e.g., the conductive pads 141 and the conductive pads 142), and the sealant 180 can surround the liquid crystal layer LC. In some embodiments, the height of the sealant 180 may be greater than that of the liquid crystal layer LC, so the liquid crystal layer LC may not overflow outside the sealant 180.

Next, the transparent conductive layer 160 may be formed on the liquid crystal layer LC. The transparent conductive layer 160 may be selectively disposed or not disposed on the sealant 180, but it is not limited thereto.

Next, the polarizer 210 can be selectively disposed on the liquid crystal layer LC. Next, the inspection step is performed. As the above, the predetermined voltages are first applied to the conductive pads 141 (and/or the conductive pads 142) and the transparent conductive layer 160 respectively, and an electric field (e.g., a vertical electric field) is generated to rotate the liquid crystal molecules in the liquid crystal layer LC between the conductive pads 141 (and/or the conductive pads 142) and the transparent conductive layer 160. Then, the inspection light of the light source 300 can partially pass through the polarizer 210 and irradiate the conductive pads 141 or the conductive pads 142 according to the rotation of the liquid crystal molecules. Then, the inspection light reflects the light through the conductive pads 141 or the conductive pads 142, and the reflected light can be inspected by the sensor 202 of the inspection component 200 and output an image or a numerical text, but it is not limited thereto. The user can determine whether the conductivity of the conductive pad 141 or the conductive pad 142 meets the expected standard by the brightness or the value of the image.

Next, the user can perform a cutting process subsequently to separate multiple uncut package circuits 20' from one another, and it is determined whether the electronic components are coupled to the package circuit 20' according to the inspection result of the conductive pads.

Figure 4:
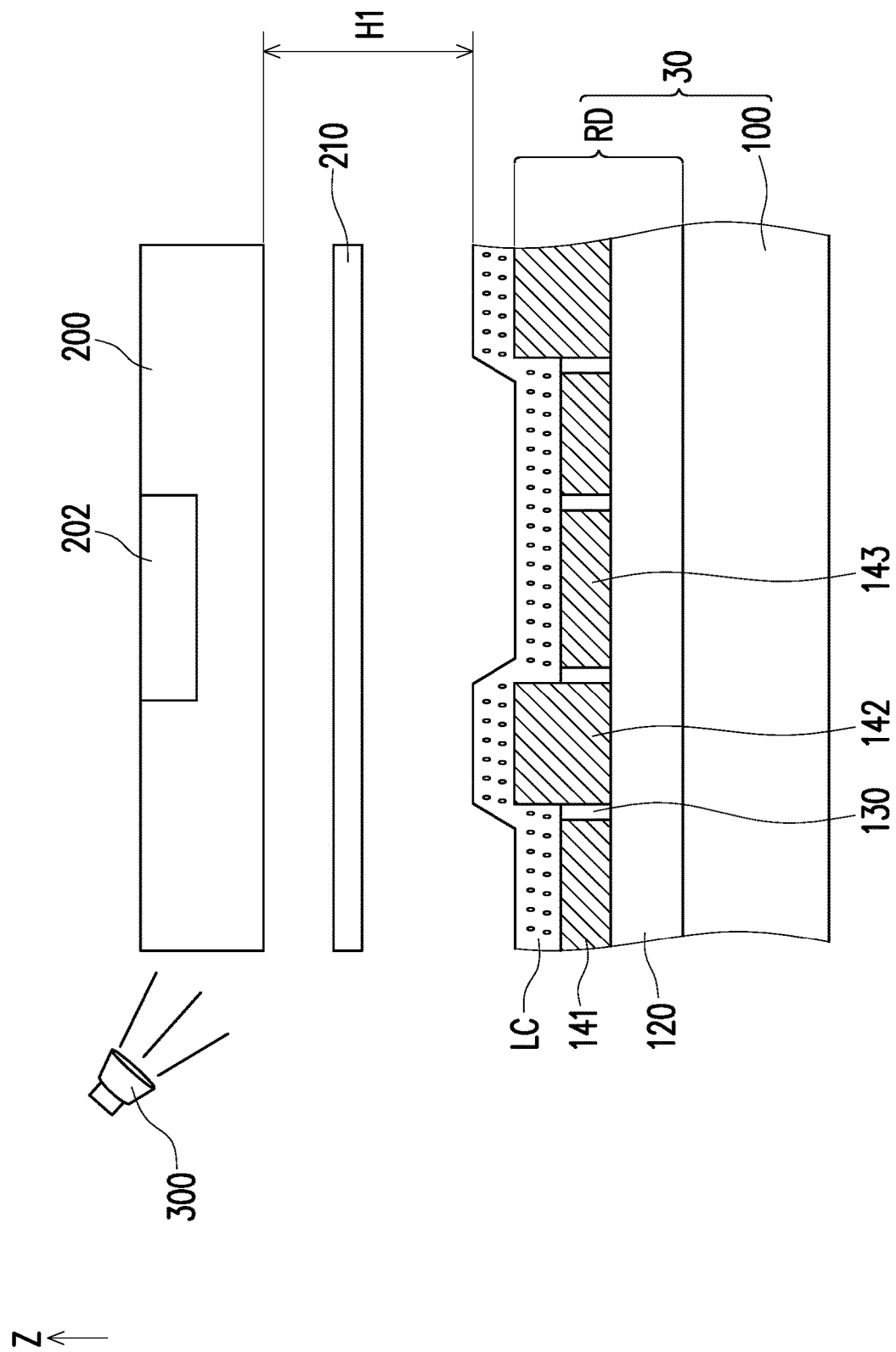
FIG. 4 is a schematic cross-sectional view of a package circuit in the inspection step according to another embodiment of the disclosure.

FIG. 4 is a schematic cross-sectional view of a package circuit in the inspection step according to another embodiment of the disclosure. For clarity of the drawings and convenience of description, several components are omitted in FIG. 4. The configuration of the package circuit 30 in the inspection step shown in the embodiment is substantially similar to the configuration of the package circuit 10 in the inspection step shown in FIG. 1. Therefore, the same and similar components in the two embodiments are not iterated. The difference between the configuration of the embodiment and the configuration of the inspection package circuit 10 is that after disposing the liquid crystal layer LC (the transparent conductive layer 160 is not disposed on the liquid crystal layer LC), the inspection component 200 is provided and the inspection step is performed.

In the embodiment, the inspection step includes the following steps. A power signal is first provided to apply the predetermined voltages to at least two adjacent ones of the conductive pads respectively to generate an electric field, and the voltage applied to at least two of the conductive pads can be different. For example, the at least two adjacent ones of the conductive pads are the conductive pad 141 (adjacent to the conductive pad 142) and the conductive pad 142, or the conductive pad 142 and the conductive pad 143 (adjacent to the conductive pad 142), but the disclosure is not limited thereto. Taking FIG. 4 as an example, the user can apply the predetermined voltages to the conductive pad 141 and the conductive pad 142 respectively to generate an electric field (e.g., a horizontal electric field) between the conductive pad 141 and the conductive pad 142. For example, the horizontal electric field is an electric field perpendicular to the normal direction Z of the surface of the substrate 100.

Next, the generated electric field (e.g., the horizontal electric field) may change the rotation of the liquid crystal molecules in the liquid crystal layer LC, such as causing the liquid crystal molecules to rotate according to the direction of the electric field, but the disclosure is not limited thereto. Next, the light source 300 with directivity can be selectively used as the inspection light. Then, like the description in the embodiment of FIG. 1, the user can determine the conductivity of the conductive pads (including the conductive pad 141, the conductive pad 142 or the conductive pad 143) according to the result of the rotation of the liquid crystal molecules of the liquid crystal layer LC oriented with the electric field. For example, the predetermined voltages applied to the conductive pad 141 and the conductive pad 142 respectively, or the predetermined voltages applied to the conductive pad 142 and the conductive pad 143 (adjacent to the conductive pad 142) respectively to generate an electric field can be inspected at different time points by alternately inspecting the conductive pads 142 with different adjacent conductive pads (e.g., the conductive pad 141 and the conductive pad 143, but the disclosure is not limited thereto), to obtain the conductivity of the conductive pads (including the conductive pad 141, the conductive pad 142, or the conductive pad 143).

For example, when the voltage of the conductive pad 141 is less than the predetermined voltage, the voltages of the conductive pad 142 and the adjacent conductive pad 143 are close to the predetermined voltage, and the conductive pad 141 and the conductive pad 143 respectively are adjacent to the conductive pad 142 and located on opposite sides of the conductive pad 142. The rotation of the liquid crystal layer LC caused by an electric field (a horizontal electric field) on the conductive pad 141 and the conductive pad 142 is not significant (i.e., the liquid crystal molecules cannot rotate to the expected degree of rotation), and the rotation of the liquid crystal layer LC caused by an electric field on the conductive pad 142 and the conductive pad 143 may be significant (i.e., the liquid crystal molecules substantially rotate to the expected degree of rotation). The amount of inspection light passing through the liquid crystal layer LC on the conductive pad 141 and the conductive pad 142 may be reduced, the amount of the inspection light reflected may be less than the expected amount (i.e., the brightness inspected by the inspection component 200 is lower), and the amount of inspection light passing through the liquid crystal layer LC on the conductive pad 142 and the conductive pad 143 can satisfy the expectations. Therefore, the amount of the reflected inspection light can satisfy expectations (i.e., the brightness inspected by the inspection component 200 can satisfy the expectations). Accordingly, the user can determine the conductivity of the conductive pads (including the conductive pad 141, the conductive pad 142, or the conductive pad 143) through the above contrast of the alternate inspection.

The manufacturing method of the package circuit 30 is a non-contact technology, which can reduce the risk of damages to the conductive pads during inspection. The inspection distance H1 between the inspection component 200 and the circuit structure RD may not be limited. The manufacturing method of the package circuit 30 can achieve excellent technical effects similar to those in the above embodiment.

Figure 5:
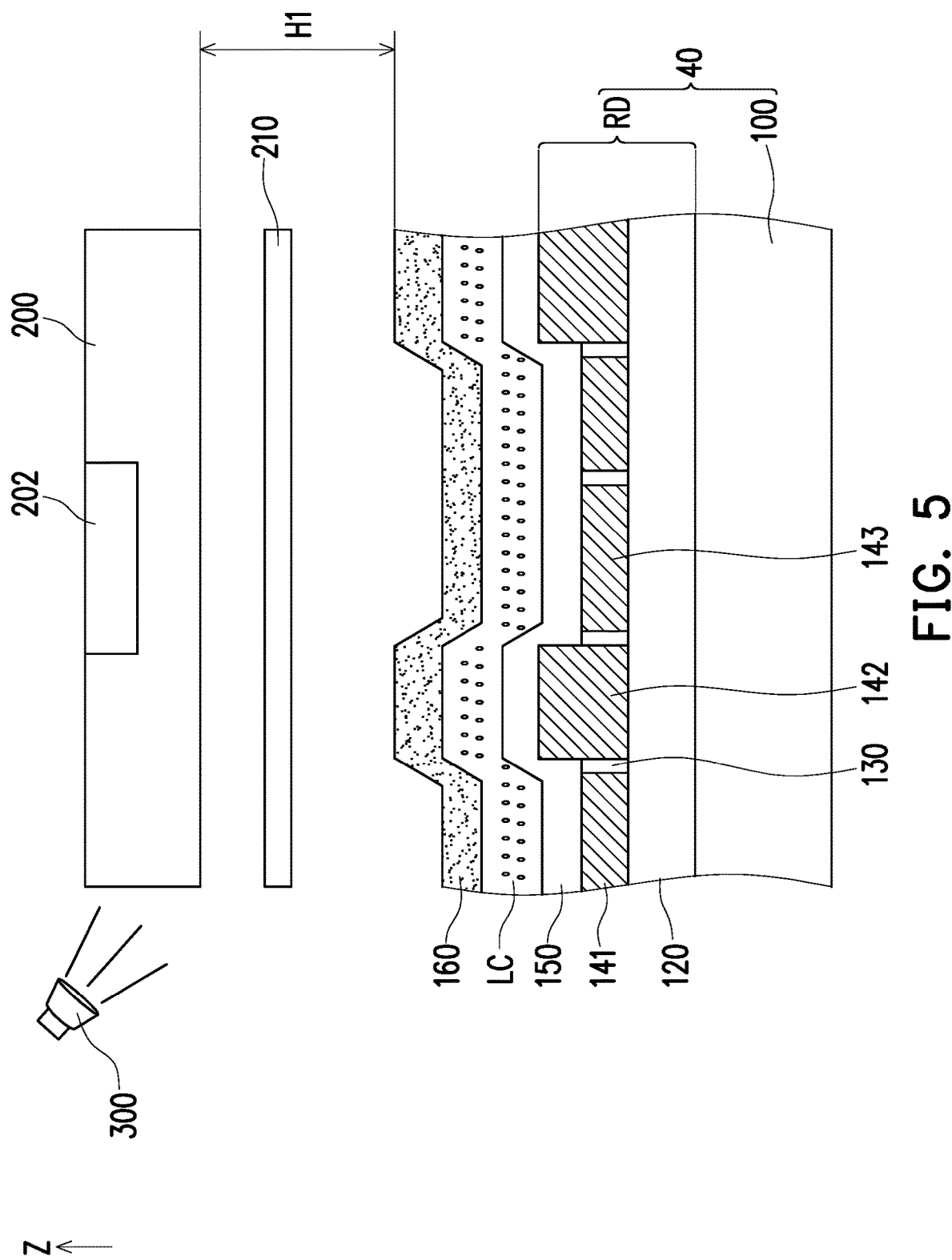
FIG. 5 is a schematic cross-sectional view of a package circuit in the inspection step according to another embodiment of the disclosure.

FIG. 5 is a schematic cross-sectional view of a package circuit in the inspection step according to another embodiment of the disclosure. For clarity of the drawings and convenience of description, several components are omitted in FIG. 5. The configuration of the package circuit 40 in the inspection step shown in the embodiment is substantially similar to the configuration of the package circuit 10 in the inspection step shown in FIG. 1. Therefore, the same and similar components in the two embodiments are not iterated. The difference between the configuration of the embodiment and the configuration of the inspection package circuit 10 is mainly that the manufacturing method of the package circuit 40 may include disposing the substrate 150 between the circuit structure RD and the liquid crystal layer LC. For example, after the circuit structure RD is provided, the liquid crystal layer LC and/or the transparent conductive layer 160 is first formed on the substrate 150, and then the substrate 150 (with the formed liquid crystal layer LC and/or the transparent conductive layer 160) is disposed on the circuit structure RD, so the substrate is disposed between the circuit structure RD and the liquid crystal layer LC and/or the transparent conductive layer 160. In some embodiments, the substrate 150 may include a flexible board, such as polyimide (PI), polyethylene terephthalate (PET), other suitable materials, or a combination thereof, but it is not limited thereto. With the above configuration, after the inspection step is completed, the substrate 150 can be removed simply to remove the liquid crystal layer LC (and/or the transparent conductive layer 160). In some embodiments, the method of removing the substrate 150 includes a physical tearing method, but it is not limited thereto. Accordingly, the stack of the substrate 150, the liquid crystal layer LC, and/or the transparent conductive layer 160 can be reused on other package circuits to be inspected, thereby saving the cost or facilitating the process.

In some embodiments (not shown), an alignment layer (not shown) and the liquid crystal layer LC (and/or the transparent conductive layer 160) may be selectively formed on the substrate 150. The alignment layer may be disposed between the liquid crystal layer LC and the circuit structure RD, for example, but it is not limited thereto.

The manufacturing method of the package circuit 40 is a non-contact technology, which can reduce the risk of damages to the conductive pads during inspection. The inspection distance H1 between the inspection component 200 and the circuit structure RD may not be limited. Moreover, the manufacturing method of the package circuit 40 can achieve excellent technical effects similar to the above embodiment.

Figure 6:
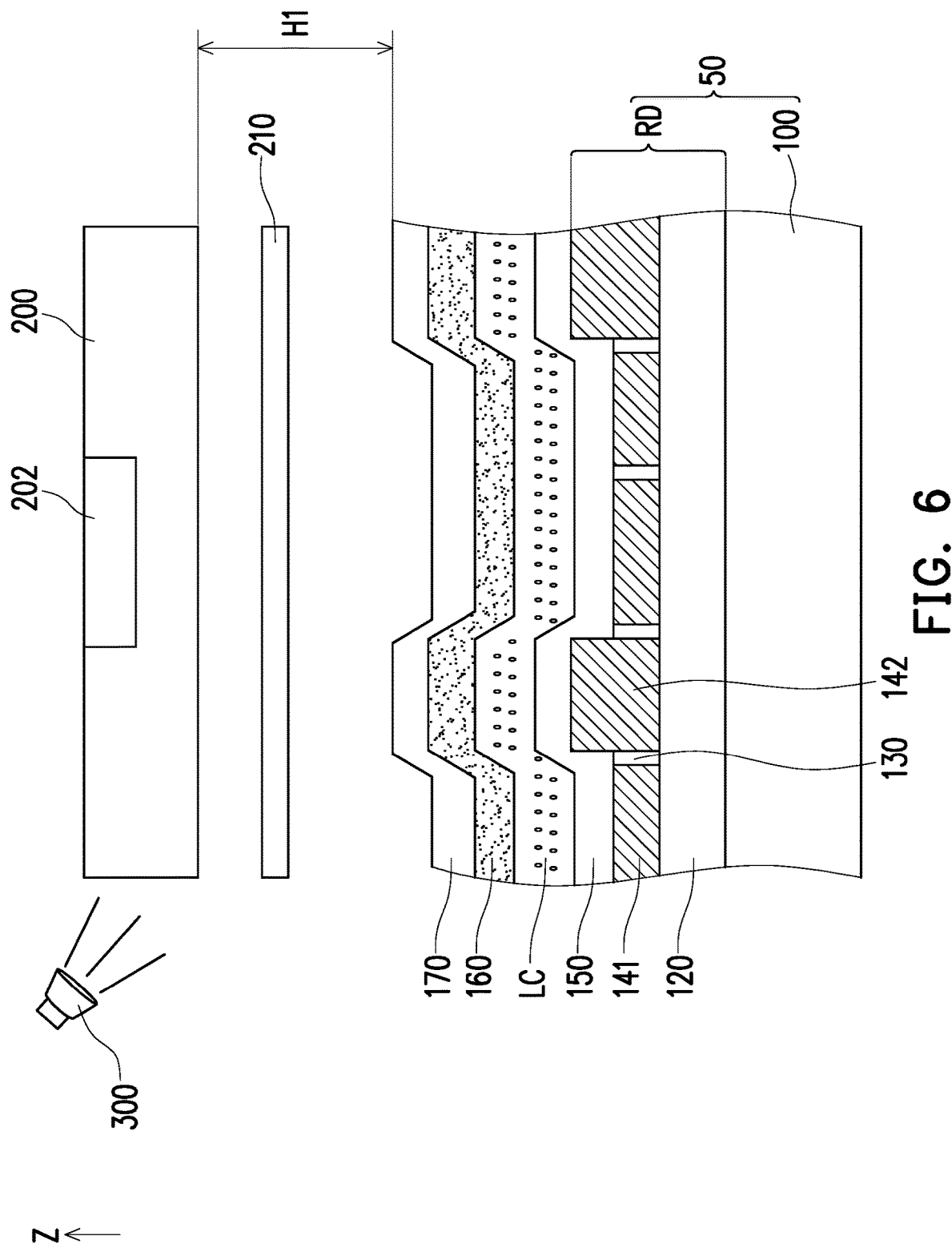
FIG. 6 is a schematic cross-sectional view of a package circuit in the inspection step according to another embodiment of the disclosure.

FIG. 6 is a schematic cross-sectional view of a package circuit in the inspection step according to another embodiment of the disclosure. For clarity of the drawings and convenience of description, several components are omitted in FIG. 6. The configuration of the package circuit 50 shown in the embodiment is substantially similar to the configuration of the package circuit 40 shown in FIG. 5. Therefore, the same and similar components in the two embodiments are not iterated. The difference between the configuration of the embodiment and the configuration of the inspection package circuit 40 is mainly that the manufacturing method of the package circuit 50 may further include disposing a substrate 170 on the transparent conductive layer 160 (and/or the liquid crystal layer LC).

For example, after the circuit structure RD is provided, the liquid crystal layer LC (and/or the transparent conductive layer 160) is first formed on the substrate 150, then the substrate 150 (with the formed liquid crystal layer LC and/or the transparent conductive layer 160) is disposed on the circuit structure RD, and then the substrate 170 is formed on the liquid crystal layer LC and/or the transparent conductive layer 160. However, the disclosure is not limited thereto.

In other embodiments, after the circuit structure RD is formed, the liquid crystal layer LC (and/or the transparent conductive layer 160) is formed on the substrate 170. The substrate 170 (with the formed liquid crystal layer LC and/or the transparent conductive layer 160) is turned over so that the liquid crystal layer LC may face the circuit structure RD and is disposed on the circuit structure RD or the substrate 150 (the substrate 150 can be disposed on the circuit structure RD after the circuit structure RD is formed), and the liquid crystal layer LC (and/or the transparent conductive layer 160) may be disposed between the substrate 170 and the substrate 150, but it is not limited thereto. In the embodiment, the substrate 150 may selectively not be provided, that is, the substrate 150 may not be disposed between the circuit structure RD and the liquid crystal layer LC.

In other embodiments, the liquid crystal layer LC and the transparent conductive layer 160 can be formed on different substrates respectively. For example, the manufacturing method further comprises forming a transparent conductive layer 160 on a substrate 170, and then disposing the substrate 170 with the formed transparent conductive layer 160 on the substrate 150 with the formed liquid crystal layer LC so that the transparent conductive layer 160 may be disposed between the liquid crystal layer LC and the substrate 170. In other words, the liquid crystal layer LC may be formed on the substrate 150, the transparent conductive layer 160 may be formed on the substrate 170, and subsequently they can be sequentially stacked and disposed on the circuit structure RD as shown in FIG. 6.

In some embodiments, the materials of the substrate 150 and the substrate 170 may be the same or different. With the above configuration, after the inspection step is completed, the substrate 150 and/or the substrate 170 can be removed simply to remove the liquid crystal layer LC and/or the transparent conductive layer 160 on the substrate 150 and/or the substrate 170.

Similarly, the method of removing the substrate 150 and/or the substrate 170 includes a physical tearing method, but the disclosure is not limited thereto. Accordingly, the substrate 150, the liquid crystal layer LC, the transparent conductive layer 160 and/or a stack of the substrate 170 can be reused on other package circuits to be inspected. Accordingly, the process is facilitated, and the cost is saved.

With the above configuration, the manufacturing method of the package circuit 50 can realize the non-contact technology, which can reduce the risk of damages to the conductive pads during inspection. The inspection distance H1 between the inspection component 200 and the circuit structure RD may not be limited.

The manufacturing process and the rationale of the inspection step are briefly illustrated through FIG. 7 and FIG. 8 in the following paragraphs.

Figure 7:
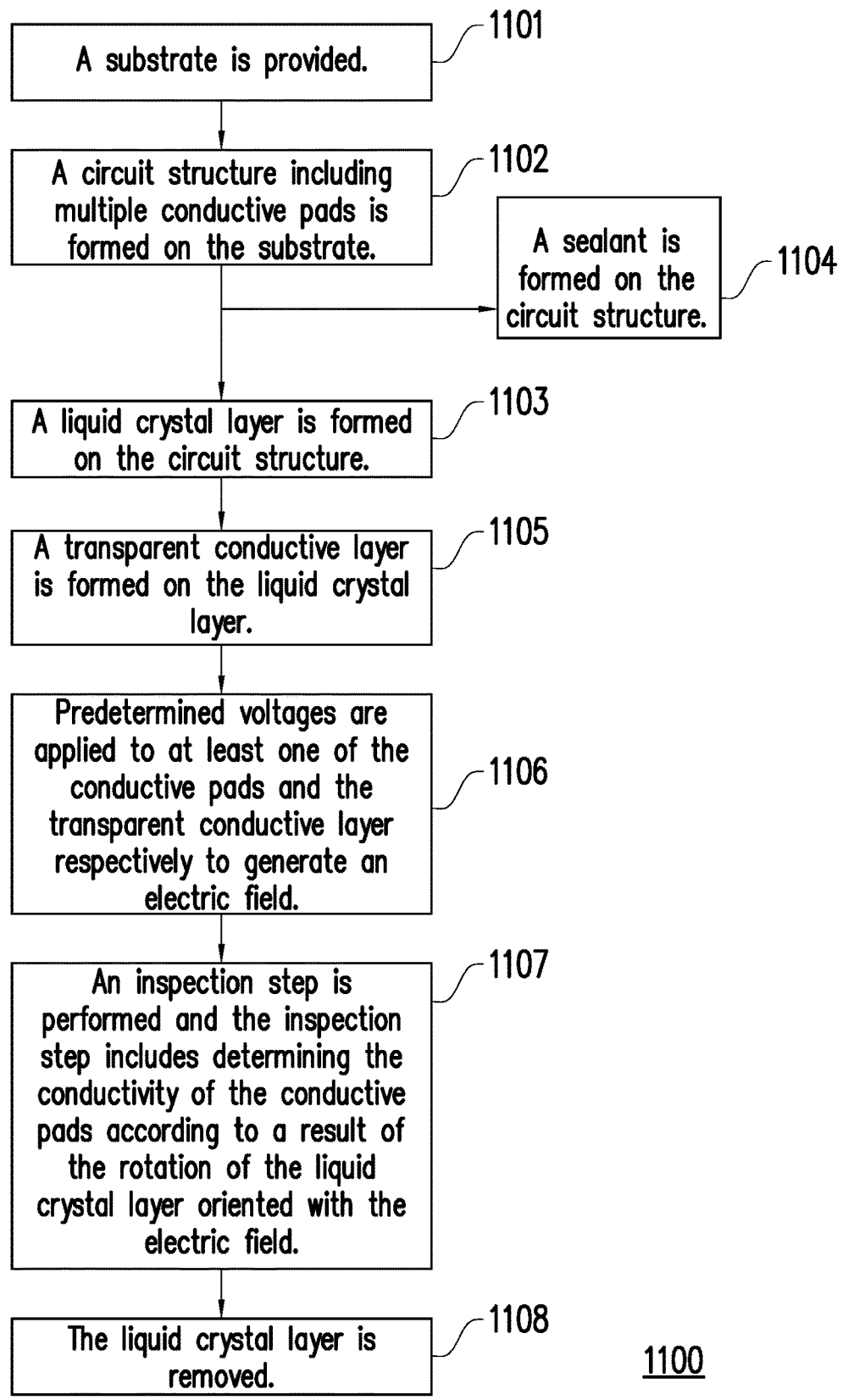
FIG. 7 is a flowchart illustrating a manufacturing method of a package circuit according to another embodiment of the disclosure.

FIG. 7 is a flowchart illustrating a manufacturing method of a package circuit according to another embodiment of the disclosure. FIG. 8 is a three-dimensional schematic view illustrating part of an enlarged circuit structure according to another embodiment of the disclosure. For clarity of the drawings and convenience of description, several components are omitted in FIG. 8. A manufacturing method 1100 of the circuit structure includes the following steps.

In step 1101, a substrate is provided.

In step 1102, a circuit structure including a plurality of conductive pads is formed on the substrate.

In step 1103, a liquid crystal layer is formed on the circuit structure.

Before performing step 1103, step 1104 may be selectively performed first. In step 1104, a sealant is formed on the circuit structure, then step 1103 is performed to form the liquid crystal layer on the circuit structure, and the sealant surrounds the liquid crystal layer.

In step 1105, a transparent conductive layer is formed on the liquid crystal layer.

In step 1106, the predetermined voltages are applied to at least one of the conductive pads and the transparent conductive layer respectively to generate an electric field. In step 1106, the generated electric field is a vertical electric field, for example. However, the disclosure is not limited thereto.

In step 1107, the inspection step is performed and the inspection step includes determining the conductivity of the conductive pads according to the result of the rotation of the liquid crystal layer oriented with the electric field.

Figure 8:
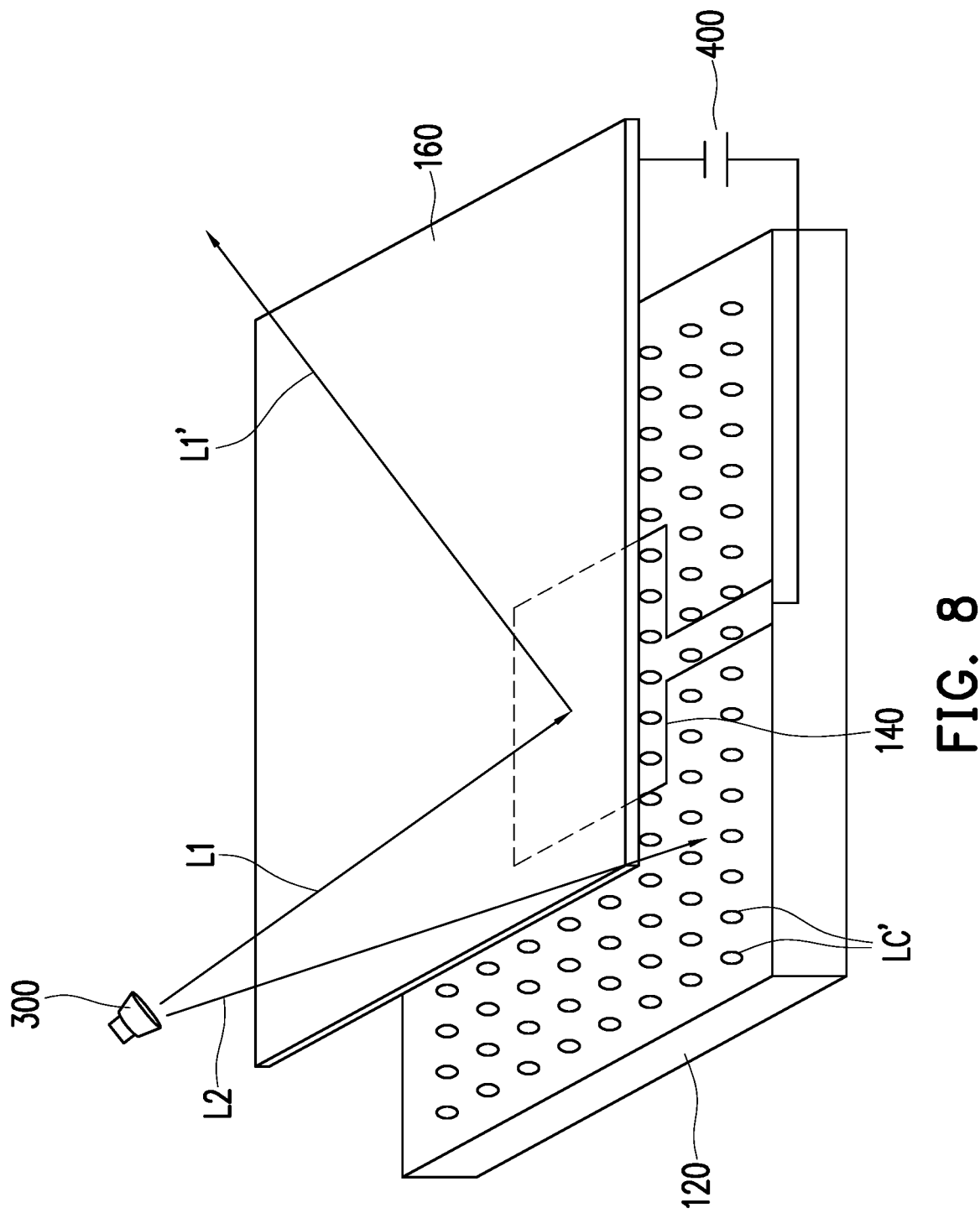
FIG. 8 is a three-dimensional schematic view illustrating part of an enlarged circuit structure according to another embodiment of the disclosure.

Referring to FIG. 8, a conductive pad 140 (which may be the conductive pad 141 or the conductive pad 142 of FIG. 1) may be disposed on the interconnection structure 120. The liquid crystal molecules LC' of the liquid crystal layer LC may be formed on the interconnection structure 120 and/or the conductive structure 140. The transparent conductive layer 160 may be disposed on the liquid crystal molecules LC'. The conductive pad 140 and the transparent conductive layer 160 respectively can be electrically connected to a power supply device 400. By applying the predetermined voltages to at least one of the conductive pads 140 and the transparent conductive layer 160 respectively through the power supply device 400, an electric field may be generated between the conductive pad 140 and the transparent conductive layer 160 when the predetermined voltages are applied, the electric field changes the liquid crystal molecules LC' located between the conductive pad 140 and the transparent conductive layer 160, causing the liquid crystal molecules LC' to rotate according to the direction of the electric field. Subsequently, the light source 300 with directivity may be selectively used to emit inspection light, and a beam L1 of the inspection light may pass through the liquid crystal layer LC and be reflected by the conductive pad 140, for example.

In some embodiments, the liquid crystal layer may include dye-doped liquid crystals, and the liquid crystal molecules LC' can rotate toward a direction parallel to the electric field. When the conductive pad 140 may receive the predetermined voltage, an expected electric field (a vertical electric field) can be generated between the conductive pad 140 and the transparent conductive layer 160, the liquid crystal molecules LC' located between the conductive pad 140 and the transparent conductive layer 160 can substantially rotate in a direction parallel to the electric field, and the dye molecules can rotate along the rotation direction of the liquid crystal molecules LC', so the beam L1 of the inspection light can penetrate the rotated liquid crystal molecules LC' and/or the dye molecules to be reflected by the conductive pad 140. The reflected light L1' can be inspected by the inspection component (as shown in FIG. 1). Moreover, other liquid crystal molecules LC' and/or dye molecules that are not located between the conductive pad 140 and the transparent conductive layer 160 may not rotate substantially, part of a beam L2 of the inspection light passing through these regions may be absorbed by the dye molecules, but it is not limited thereto. Therefore, the user can determine the rotation result of the liquid crystal layer LC by observing the brightness of the reflected light L1', the user can determine whether the conductive pad 140 receives the predetermined voltage. Through the inspection method, the probability of performing subsequent processes on package circuits that do not meet the expected standard can be reduced, and reducing the cost or improving the quality.

In step 1108, the liquid crystal layer is removed. In some embodiments, as the above, the removed liquid crystal layer and/or the removed transparent conductive layer can be reused on other package circuits to be inspected.

Figure 9:
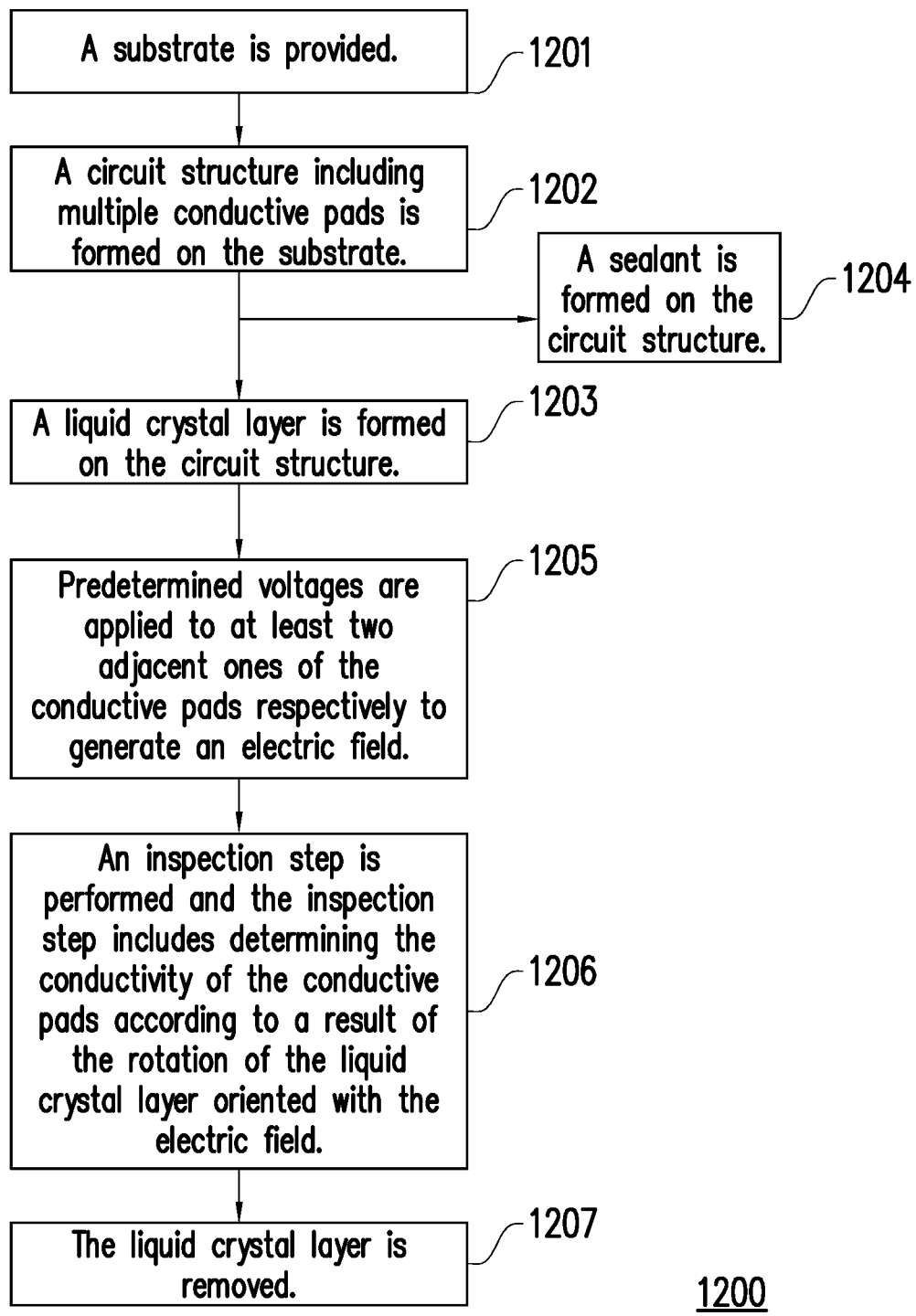
FIG. 9 is a flowchart illustrating a manufacturing method of a package circuit according to another embodiment of the disclosure.

FIG. 9 is a flowchart illustrating a manufacturing method of a package circuit according to another embodiment of the disclosure. A manufacturing method 1200 of the circuit structure includes the following steps.

In step 1201, a substrate is provided.

In step 1202, a circuit structure including a plurality of conductive pads is formed on the substrate.

In step 1203, a liquid crystal layer is formed on the circuit structure.

Before performing step 1203, step 1204 may be selectively performed first. In step 1204, a sealant is formed on the circuit structure, then step 1203 is performed to form the liquid crystal layer on the circuit structure, and the sealant surrounds the liquid crystal layer.

In step 1205, the predetermined voltages are applied to at least two adjacent ones of the conductive pads respectively to generate an electric field. In step 1205, the generated electric field may be a horizontal electric field. However, the disclosure is not limited thereto.

In step 1206, the inspection step is performed, and the inspection step includes determining the conductivity of the conductive pads according to the result of the rotation of the liquid crystal layer oriented with the electric field.

In step 1207, the liquid crystal layer is removed. In some embodiments, the removed liquid crystal layer and the removed transparent conductive layer can be used on other package circuits to be inspected. Accordingly, the liquid crystal layer and/or the transparent conductive layer can be reused in the inspection step, which further facilitates the process and saves the cost.

Figure 10:
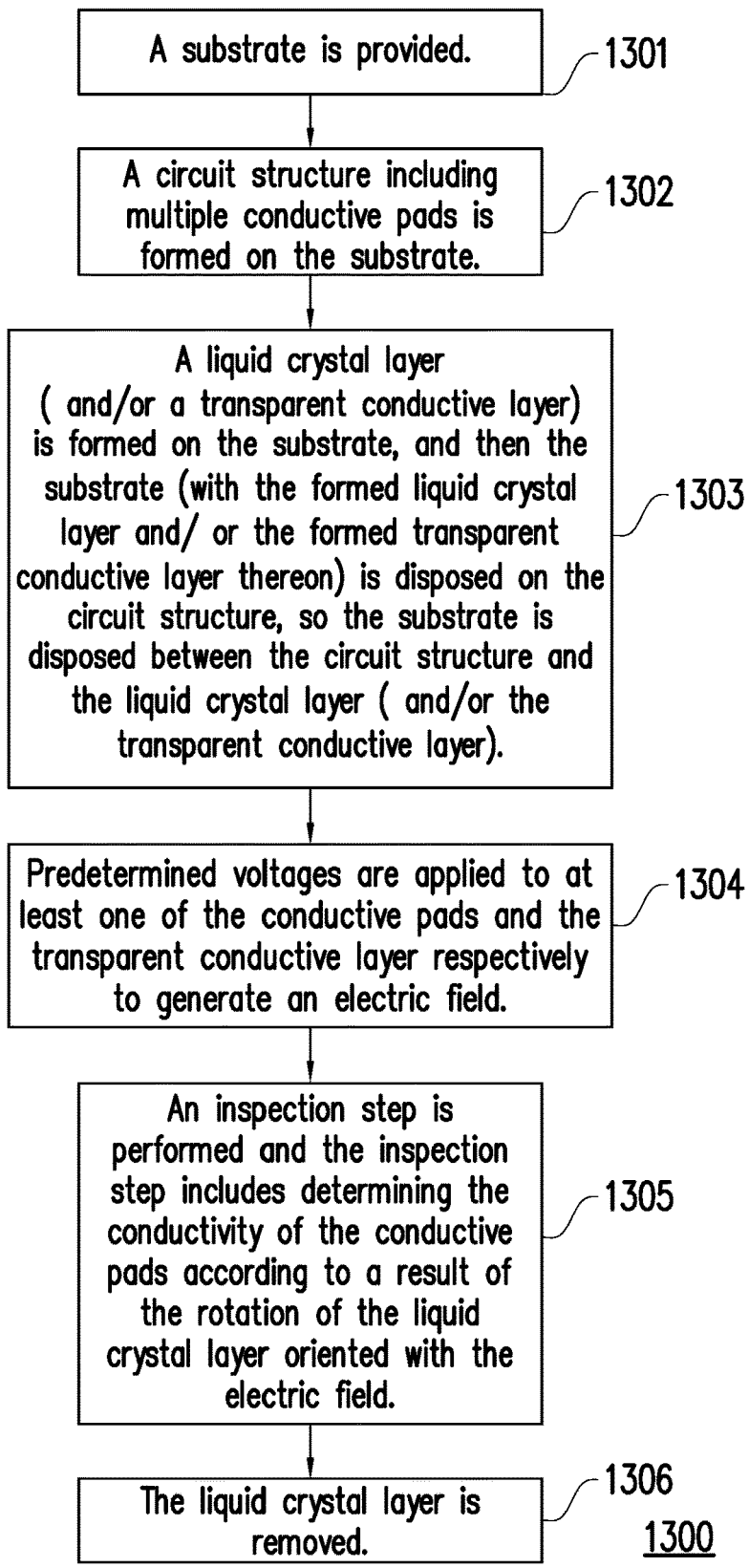
FIG. 10 is a flowchart illustrating a manufacturing method of a package circuit according to yet another embodiment of the disclosure.

FIG. 10 is a flowchart illustrating a manufacturing method of a package circuit according to yet another embodiment of the disclosure. A manufacturing method 1300 of the circuit structure includes the following steps.

In step 1301, a substrate is provided.

In step 1302, a circuit structure including a plurality of conductive pads is formed on the substrate.

In step 1303, the liquid crystal layer (and/or the transparent conductive layer) is formed on the substrate, and then the substrate with the formed liquid crystal layer (and/or the formed transparent conductive layer) may be disposed on the circuit structure, wherein the substrate may be disposed between the circuit structure and the liquid crystal layer (and/or the transparent conductive layer). In some embodiment, a transparent conductive layer may be formed on the liquid crystal layer.

In step 1304, the predetermined voltages are applied to at least one of the conductive pads and the transparent conductive layer respectively to generate an electric field (e.g., a vertical electric field). In step 1305, the inspection step is performed, and the inspection step includes determining the conductivity of the conductive pads according to the result of the rotation of the liquid crystal layer oriented with the electric field.

In step 1306, the liquid crystal layer (and/or (or the substrate) may be removed, and the liquid crystal layer and/or the transparent conductive layer formed on the substrate is removed). In some embodiments, the removed liquid crystal layer and the removed transparent conductive layer can be reused on other package circuits to be inspected. Accordingly, the process is facilitated, and the cost is saved.

Figure 11:
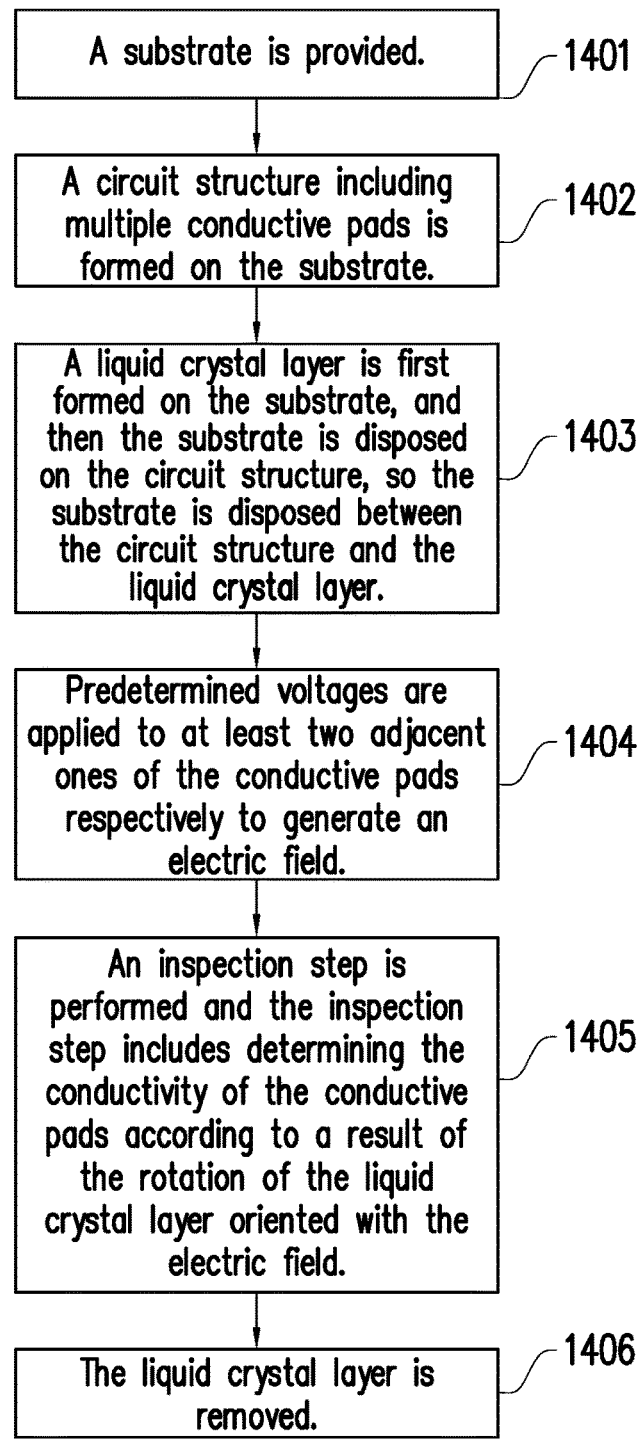
FIG. 11 is a flowchart illustrating a manufacturing method of a package circuit according to still another embodiment of the disclosure.

FIG. 11 is a flowchart illustrating a manufacturing method of a package circuit according to still another embodiment of the disclosure. A manufacturing method 1400 of the circuit structure includes the following steps.

In step 1041, a substrate is provided.

In step 1402, a circuit structure including a plurality of conductive pads is formed on the substrate.

In step 1403, the liquid crystal layer may be formed on the substrate, and then the substrate with the formed liquid crystal layer may be disposed on the circuit structure, wherein the substrate may be disposed between the circuit structure and the liquid crystal layer.

In step 1404, the predetermined voltages are applied to at least two adjacent ones of the conductive pads respectively to generate an electric field (e.g., a horizontal electric field). In step 1405, the inspection step is performed, and the inspection step includes determining the conductivity of the conductive pads according to the result of the rotation of the liquid crystal layer oriented with the electric field.

In step 1406, the liquid crystal layer is removed (or the substrate is removed, and the liquid crystal layer formed on the substrate is removed). In some embodiments, the removed liquid crystal layer can be reused on other package circuits to be inspected. Accordingly, the process is facilitated, and the cost is saved.

Based on the above, in the manufacturing method of the package circuit in an embodiment of the disclosure, the liquid crystal layer may be formed on the circuit structure to be inspected, and then the conductivity of the conductive pads is determined according to the result of the rotation of the liquid crystal molecules in the liquid crystal layer oriented with the electric field. The inspection method is a non-contact inspection, which can reduce the risk of damages to the conductive pads during inspection. Moreover, the liquid crystal layer may be disposed on the circuit structure, the distance between the inspection component and the circuit structure may not be limited. Moreover, the inspection step can be performed during the manufacturing process of the package circuit, the probability of bonding the electronic components to the package circuit that fails to meet the expected standard can be reduced, thereby reducing the cost or improving the quality.

It should be finally noted that the above embodiments are merely intended for describing the technical solutions of the present disclosure rather than limiting the present disclosure. The features of the embodiments may be used in any combination without departing from the spirit of the present disclosure or conflicting with each other. Although the present disclosure is described in detail with reference to the foregoing embodiments, those of ordinary skill in the art should understand that they can still make modifications to the technical solutions described in the foregoing embodiments or make equivalent substitutions to some or all technical features thereof, without departing from scope of the technical solutions of the embodiments of the present disclosure.

What is claimed is:

1. A manufacturing method of a package circuit, comprising:
   forming a circuit structure comprising a plurality of conductive pads on a substrate;
   forming a liquid crystal layer on the circuit structure, wherein the liquid crystal layer contacts the circuit structure;
   performing an inspection step comprising:
   determining conductivity of the plurality of the conductive pads according to a result of a rotation of the liquid crystal layer oriented with an electric field; and
   removing the liquid crystal layer after the inspection step is performed,
   wherein the manufacturing method further comprises:
   forming a sealant on the circuit structure, so that the sealant surrounds the liquid crystal layer and the plurality of the conductive pads; and
   forming a transparent conductive layer on the liquid crystal layer and the sealant,
   wherein, in a normal direction of the substrate, a maximum height of the sealant is greater than a maximum height of the liquid crystal layer.

2. The manufacturing method of claim 1, wherein the inspection step further comprises applying predetermined voltages to at least one of the plurality of the conductive pads and the transparent conductive layer respectively to generate the electric field.

3. The manufacturing method of claim 1, wherein the inspection step further comprises applying predetermined voltages to at least two adjacent ones of the plurality of the conductive pads respectively to generate the electric field.

4. The manufacturing method of claim 1, wherein the substrate includes a flexible substrate.

5. The manufacturing method of claim 1, wherein the manufacturing method further comprises forming a transparent conductive layer on another substrate, and then disposing the another substrate on the substrate so that the transparent conductive layer is disposed between the liquid crystal layer and the another substrate.

* * * * *